(12) United States Patent
Ok et al.

(10) Patent No.: US 8,551,271 B2
(45) Date of Patent: *Oct. 8, 2013

(54) METHOD FOR PROVIDING HERMETIC ELECTRICAL FEEDTHROUGH

(75) Inventors: Jerry Ok, Canyon Country, CA (US); Robert J. Greenberg, Los Angeles, CA (US)

(73) Assignee: Second Sight Medical Products, Inc., Sylmar, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/924,408

(22) Filed: Oct. 25, 2007

(65) Prior Publication Data

US 2008/0314865 A1    Dec. 25, 2008

Related U.S. Application Data

(62) Division of application No. 11/875,198, filed on Oct. 19, 2007.

(60) Provisional application No. 60/946,086, filed on Jun. 25, 2007.

(51) Int. Cl.
   *C03B 29/00*   (2006.01)
   *B29C 65/00*   (2006.01)
   *H01B 13/00*   (2006.01)

(52) U.S. Cl.
   USPC .... 156/89.11; 156/60; 156/89.16; 156/89.12; 216/17

(58) Field of Classification Search
   USPC ................. 156/89.16, 89.11, 89.12
   See application file for complete search history.

(56) References Cited

U.S. PATENT DOCUMENTS 3,699,970 A    10/1972  Brindley et al.
4,526,535 A *   7/1985  Wunderlich ................. 432/105

(Continued)

FOREIGN PATENT DOCUMENTS

| EP | 518005 A2 * | 12/1992 | |
| EP | 1 753 279 A | 2/2007 | |
| JP | 2000290077 A * | 10/2000 | ............ C04B 35/638 |
| WO | WO 88/05959 A | 8/1988 | |

OTHER PUBLICATIONS

Hansjoerg Beutel, et al., Versatile 'Microflex'-Based Interconnection Technique, SPIE Conf. on Smart Electronics and MEMS, San Diego, CA., Mar. 1998, vol. 3328, pp. 174-182.

(Continued)

*Primary Examiner* — Philip Tucker
*Assistant Examiner* — Alex Efta
(74) *Attorney, Agent, or Firm* — Scott B. Dunbar; Gary Schnittgrund (57) ABSTRACT

A method for fabricating a hermetically sealed electrical feedthrough. The method provides a ceramic sheet and forming at least one via hole in the ceramic sheet, inserting a conductive thickfilm paste into the via hole, laminating the ceramic sheet that has a paste filled via hole between an upper ceramic sheet and a lower ceramic sheet to form an integral ceramic substrate, firing the laminated ceramic substrate to sinter the ceramic substrate and cause the paste filled via hole to form a metalized via while the laminated ceramic substrate form a hermetic seal around the metalized via. The upper ceramic sheet and the lower ceramic sheet are removed from the fired ceramic substrate to expose the upper and lower surface of the metalized via.

16 Claims, 6 Drawing Sheets

(56) References Cited

U.S. PATENT DOCUMENTS

| | | | |
|---|---|---|---|
| 4,573,481 A | | 3/1986 | Bullara |
| 4,837,049 A | | 6/1989 | Byers et al. |
| 5,006,286 A | | 4/1991 | Dery et al. |
| 5,109,844 A | | 5/1992 | de Juan, Jr. et al. |
| 5,215,088 A | | 6/1993 | Normann et al. |
| 5,216,207 A | * | 6/1993 | Prabhu et al. ............ 174/256 |
| 5,229,213 A | * | 7/1993 | Horiuchi et al. .......... 428/457 |
| 5,274,916 A | * | 1/1994 | Kawabata et al. ............ 29/848 |
| 5,302,219 A | * | 4/1994 | Hargis ................ 156/89.15 |
| 5,454,927 A | | 10/1995 | Credle et al. |
| 5,464,950 A | * | 11/1995 | Horiuchi et al. ............ 174/256 |
| 5,468,936 A | | 11/1995 | Deevi et al. |
| 5,470,412 A | * | 11/1995 | Fukuta et al. ............ 156/89.15 |
| 5,604,018 A | * | 2/1997 | Horiuchi et al. .......... 428/210 |
| 5,611,140 A | | 3/1997 | Kulesza et al. |
| 5,935,155 A | | 8/1999 | Humayun et al. |
| 6,284,080 B1 | * | 9/2001 | Haq et al. ................ 156/89.16 |
| 6,361,716 B1 | | 3/2002 | Kleyer et al. |
| 6,400,989 B1 | | 6/2002 | Eckmiller |
| 6,458,157 B1 | | 10/2002 | Suaning |
| 2002/0139556 A1 | * | 10/2002 | Ok et al. ................ 174/50.6 |
| 2005/0051253 A1 | * | 3/2005 | Tosa et al. ............ 156/89.11 |
| 2006/0162844 A1 | * | 7/2006 | Needes et al. ............ 156/89.14 |
| 2006/0234021 A1 | * | 10/2006 | Tanei et al. ............ 428/210 |
| 2007/0041164 A1 | | 2/2007 | Greenberg |
| 2008/0314502 A1 | * | 12/2008 | Ok et al. ................ 156/89.16 |

OTHER PUBLICATIONS

L. Del Castillo, et al., Flip Chip Packaging of a MEMS Neuro-Prosthetic System, IMAPS Int. Conf & Ex on Advanced Packaging & Systems, Reno, NV, Mar. 2002, pp. 158-163.

M. Pourbaix, Atlas of Electrochemical Equilibria in Aqueous Solutions, National Association of Corrosion Engineers, Houston, 1974, pp. 399-405.

* cited by examiner

METHOD FOR PROVIDING HERMETIC ELECTRICAL FEEDTHROUGH

CROSS REFERENCE TO RELATED APPLICATIONS

This application is a divisional of application Ser. No. 11/875,198, entitled "Method for Providing Hermetic Electrical Feedthrough", filed Oct. 19, 2007, which application claims the benefit of provisional Application Ser. No. 60/946,086, filed Jun. 25, 2007 for "Method and Apparatus for Providing Hermetic Electrical Feedthrough" by Jerry Ok and Robert J. Greenberg, the disclosures of which are incorporated herein by reference. This application is related to application Ser. No. 09/823,464, filed Mar. 30, 2001, now U.S. Pat. No. 7,480,988, for "Method and Apparatus for Providing Hermetic Electrical Feedthrough" by Jerry Ok and Robert J. Greenberg, the disclosure of which is incorporated herein by reference.

FEDERALLY SPONSORED RESEARCH OR DEVELOPMENT

The present disclosure was made with support from the United States Government under Grant number R24EY12893-01, awarded by the National Institutes of Health. The United States Government has certain rights in the invention.

FIELD

The present disclosure relates generally to a method and apparatus for providing electrical feedthroughs and more particularly to a method and apparatus suitable for forming hermetic electrical feedthroughs through a ceramic sheet.

BACKGROUND

Various approaches are described in the literature for fabricating hermetically sealed electrical circuit housings suitable for extended operation in corrosive environments, e.g., in medical devices implanted in a patient's body. For such applications, a housing must be formed of biocompatible and electrochemically stable materials and typically must include a wall containing multiple hermetic electrical feedthroughs. A hermetic electrical feedthrough is comprised of electrically conductive material which extends through and is hermetically sealed in the wall material.

One known approach uses an assembled pin feedthrough consisting of a conductive pin that is bonded chemically at its perimeter through brazing or the use of oxides, and/or welded, and/or mechanically bonded through compression to a ceramic body. Typically, gold is used as a braze material that wets the feedthrough pin and the ceramic body resulting in a hermetic seal. Wetting to the ceramic body requires a deposited layer of metal such as titanium. This layer acts additionally as a diffusion barrier for the gold.

Other alternative feedthrough approaches use a metal tube cofired with a green ceramic sheet. The hermeticity of the metal/ceramic interface is achieved by a compression seal formed by material shrinkage when the assembly is fired and then allowed to cool. The use of a tube inherently limits the smallest possible feedthrough to the smallest available tubing. Acceptable results have been reported only when using tubes having a diameter >40 mils in ceramic substrates at least 70 mils thick.

SUMMARY

According to a first aspect, a method of fabricating a hermetic electrical feedthrough is disclosed, the method comprising: providing a ceramic sheet having an upper surface and a lower surface; forming at least one via hole in said ceramic sheet extending from said upper surface to said lower surface; inserting a conductive thickfilm paste into said via hole; laminating the ceramic sheet with paste filled via hole between an upper ceramic sheet and a lower ceramic sheet to form a laminated ceramic substrate; firing the laminated ceramic substrate to a temperature to sinter the laminated ceramic substrate and cause the paste filled via hole to form metalized via and cause the laminated ceramic substrate to form a hermetic seal around said metalized via; and removing the upper ceramic sheet and the lower ceramic sheet material from the fired laminated ceramic substrate to expose an upper and a lower surface of the metalized via.

According to a second aspect, a method of fabricating a hermetic electrical feedthroughs is disclosed, the method comprising: providing a plurality of ceramic sheets having an upper surface and a lower surface; forming a plurality of via holes in each of the ceramic sheets extending from said upper surface to said lower surface of each ceramic sheet; inserting a conductive thickfilm paste into the via holes of each ceramic sheet; stacking the plurality of ceramic sheets on top of each other, wherein the via holes filled with conductive thickfilm paste of each ceramic sheet is substantially aligned with the via holes filled with conductive thickfilm paste of the other ceramic sheets; sandwiching the stacked ceramic sheets between an upper ceramic sheet and a lower ceramic sheet; laminating stacked plurality of ceramic sheets with the lower ceramic sheet and the upper ceramic sheet to form a laminated ceramic substrate; firing the laminated ceramic substrate to a temperature to sinter the laminated ceramic substrate and cause the paste filled via holes to form metalized vias and cause the laminated ceramic substrate to form a hermetic seal around the metalized vias; and removing the upper ceramic sheet and the lower ceramic sheet material from the fired laminated ceramic substrate to expose an upper and a lower surface of the metalized vias.

Further embodiments are shown in the specification, drawings and claims of the present application.

BRIEF DESCRIPTION OF THE FIGURES

FIGS. 4A-4M respectively depict the fabrication stages of a feedthrough assembly in accordance with the process flow illustrated in FIG. 3, wherein

In the following description, like reference numbers are used to identify like elements. Furthermore, the drawings are intended to illustrate major features of exemplary embodiments in a diagrammatic manner. The drawings are not intended to depict every feature of every implementation nor relative dimensions of the depicted elements, and are not drawn to scale.

DETAILED DESCRIPTION

The present disclosure is directed to a method and apparatus suitable for forming hermetic electrical feedthroughs in a ceramic sheet (or substrate) having a possible thickness of ≤40 mils. More particularly, the disclosure is directed to a method and apparatus for forming a structure including a hermetic electrical feedthrough which is both biocompatible and electrochemically stable and suitable for implantation in a patient's body.

Electrical feedthroughs in accordance with the present writing are intended to function in corrosive environments, e.g., in medical devices intended for implantation in a patient's body. In such applications, it is generally critical that the device housing be hermetically sealed which, of course, requires that all feedthroughs in the housing wall also be hermetic. In such applications, it is also generally desirable that the weight and size of the housing be minimized and that all exposed areas of the housing be biocompatible and electrochemically stable. Biocompatiblity assures that the implanted device has no deleterious effect on body tissue. Electrochemical stability assures that the corrosive environment of the body has no deleterious effect on the device. Ceramic and platinum materials are often used in implantable medical devices because they typically exhibit both biocompatibility and electrochemical stability.

Embodiments constructed in accordance with the present disclosure are able to achieve very high feedthrough density. For example, in applications where miniaturization is important, the feedthrough pitch, i.e., center-to-center distance between adjacent feedthroughs may be from 10 mils to 40 mils.

Figure 1:
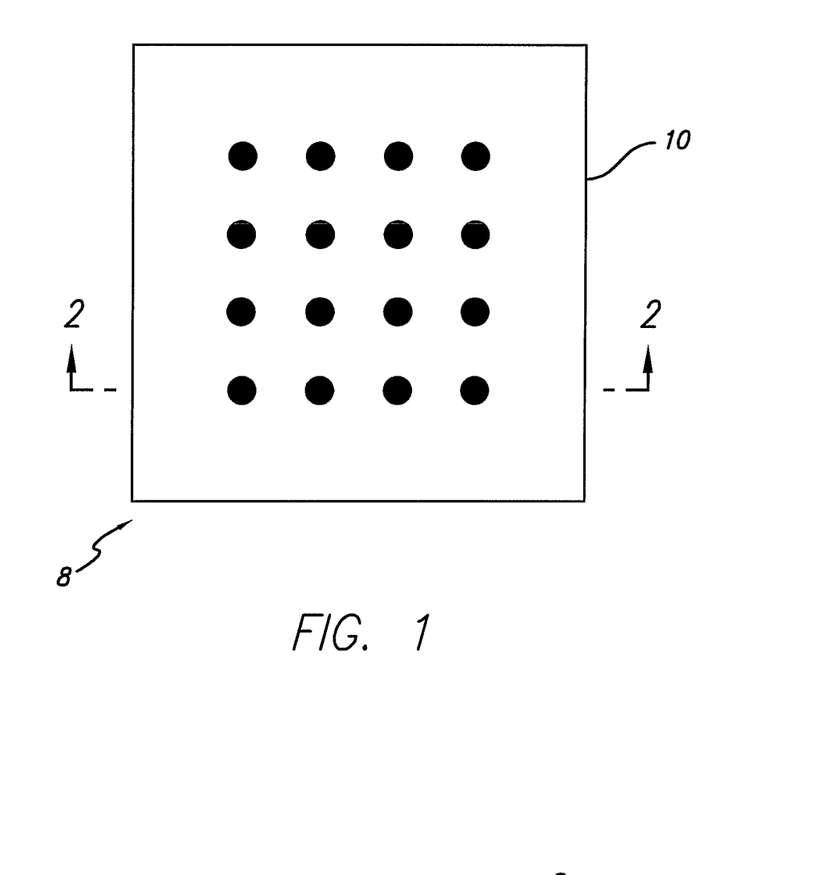
FIG. 1 depicts a top view of a finished feedthrough assembly in accordance with the present disclosure comprised of a ceramic sheet having electrically conductive vias extending therethrough.
Figure 2:
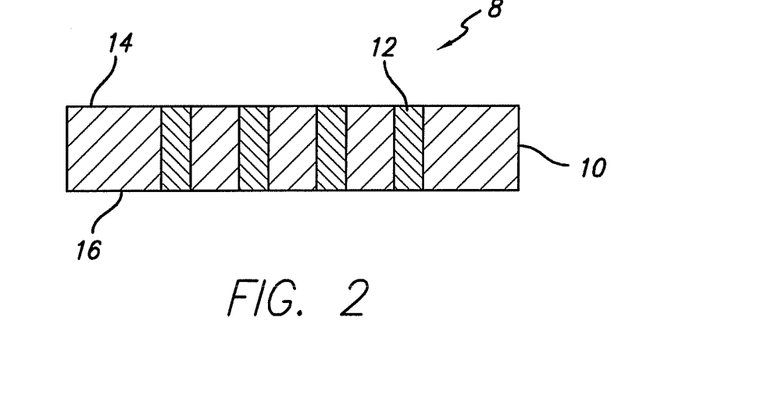
FIG. 2 depicts a sectional view taken substantially along the plane 2-2 of FIG. 1 showing the electrically conductive vias ends flush with the surfaces of the ceramic sheet.

Attention is initially directed to FIGS. 1 and 2 which depict a preferred feedthrough assembly 8 in accordance with the present disclosure comprising a thin ceramic sheet 10 of ceramic material having multiple electrical feedthroughs 12 extending therethrough terminating flush with the upper and lower surfaces 14, 16 of sheet 10. The sheet 10 typically comprises a wall portion of a housing (not shown) for accommodating electronic circuitry. The feedthroughs 12 function to electrically connect devices external to the housing, e.g., adjacent to surface 14, to electronic circuitry contained within the housing, e.g., adjacent to surface 16. "Thin ceramic sheet" as used herein refers to a sheet having a finished thickness dimension of ≤40 mils, i.e., 1 mm. The apparatus in accordance with the disclosure is particularly suited for use in corrosive environments such as in medical devices implanted in a patient's body.

The present disclosure is directed to providing electrical feedthroughs that are compatible with thin ceramic sheets (or substrates) having a finished thickness of ≤40 mils, and with feedthroughs that are hermetic, biocompatible, and electrochemically stable. In one exemplary embodiment, the ceramic sheet 10 may be formed of 90% aluminum oxide ($AlO_2$) and the feedthroughs 12 may have a diameter of ≤20 mils and may be composed of paste containing, for example, platinum.

Attention is now directed to FIGS. 3 and 4A-4M which depict the possible process steps for fabricating the finished feedthrough assembly 8 illustrated in FIGS. 1 and 2.

Figure 3:
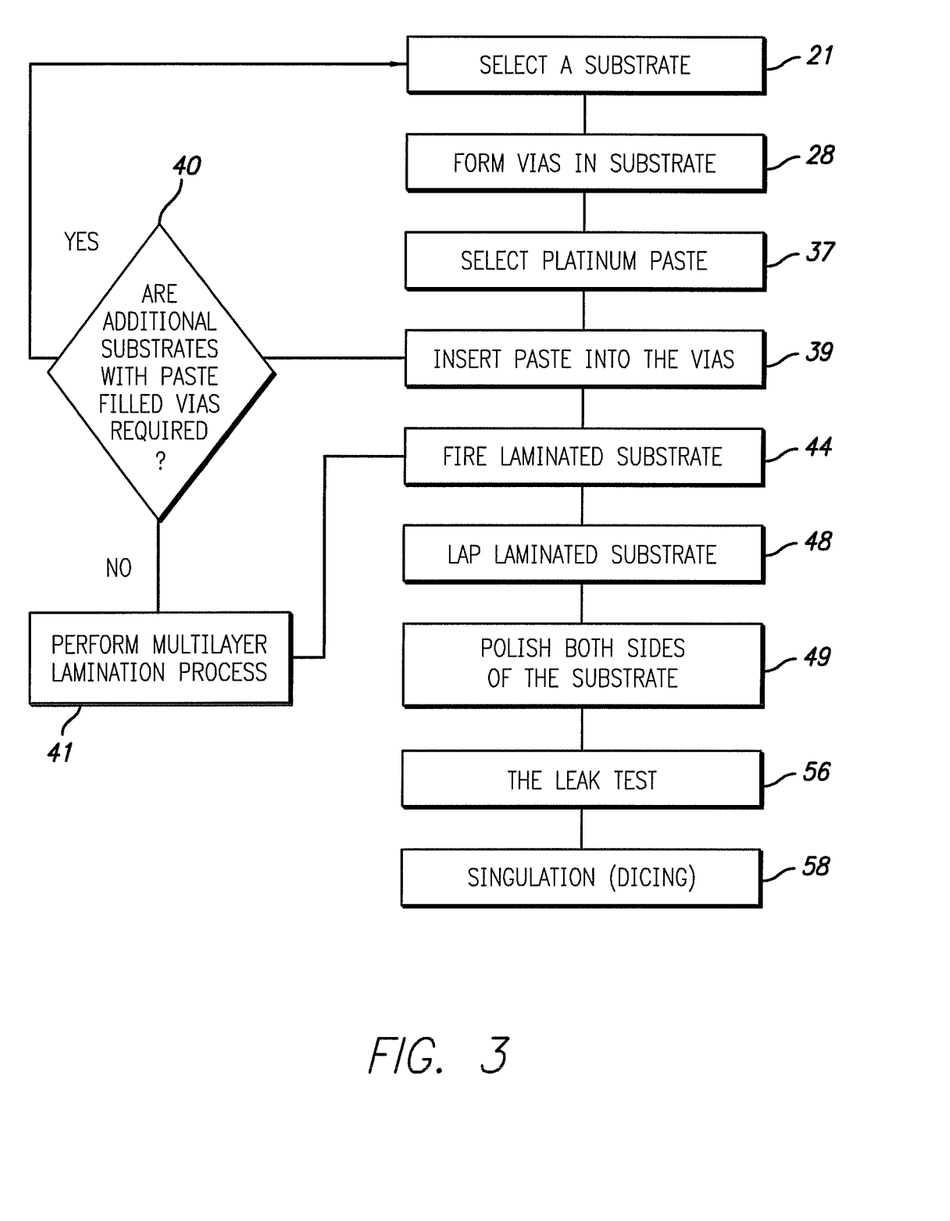
FIG. 3 depicts a flow diagram illustrating a possible series of process steps for fabricating a feedthrough assembly in accordance with the present disclosure.

Initially, a green ceramic sheet/tape/substrate 20 (FIG. 4A), formed, for example, of >90% aluminum oxide ($AlO_2$) is selected as represented by step 21 in FIG. 3. In an exemplary embodiment, the sheet 20 may have a thickness of 40 mils or less. "Green ceramic sheet/tape/substrate" as used herein refers to an unfired ceramic sheet, tape or substrate.

Figure 4A:
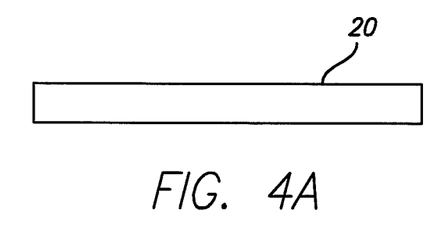
FIG. 4A depicts a sectional view of a ceramic sheet.
Figure 4B:
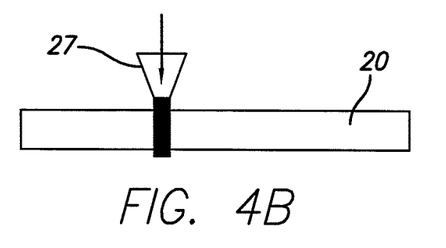
FIGS. 4B-C depict via holes being punched in the sheet of FIG. 4A.
Figure 4C:
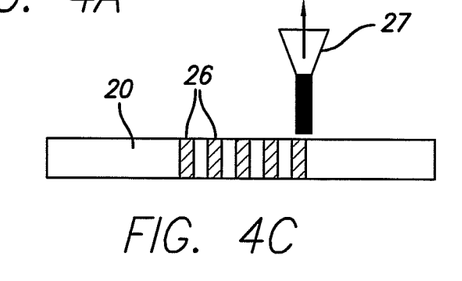

Via holes 26 are formed into the sheet 20 as represented by FIGS. 4B-4C and step 28 in FIG. 3. In an exemplary embodiment, each via hole 26 may be punched in to the sheet 20 using, for example, programmable punch tool 27. In one exemplary embodiment, a plurality of via holes 26 may be punched at the same time. It is to be understood that other methods may be used to form via holes 26. For Example, via holes 26 may be formed using solvent etching, laser ablation, and/or via holes 26 may be drilled.

Step 37 of FIG. 3 calls for selecting a conductive thickfilm paste 17 to fill in via holes 26 depicted in FIG. 4C. "Thickfilm paste" as used herein refers to a material containing inorganic particles dispersed in a vehicle comprising an organic resin and a solvent. Types of different pastes are disclosed in U.S. Pat. No. 5,601,638, the disclosure of which is incorporated herein by reference.

Figure 4D:
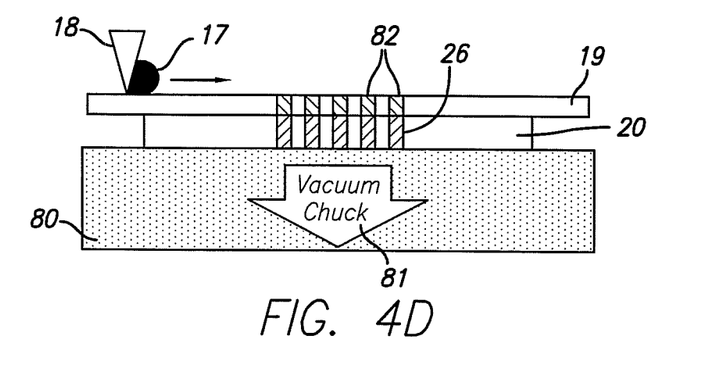
FIGS. 4D-E depict exemplary stencil printing with vacuum pull down process.
Figure 4E:
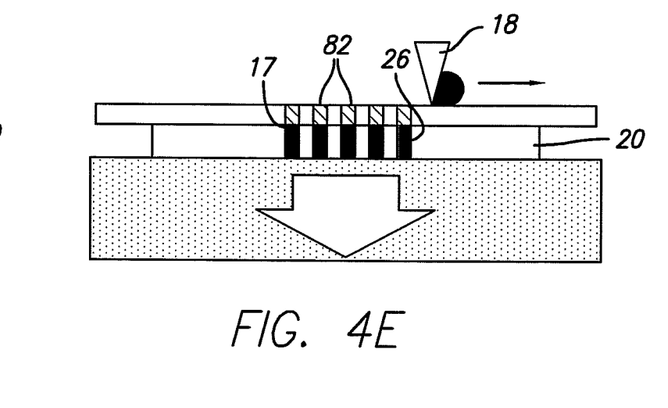

In one exemplary embodiment, a stencil printing with vacuum pull down process may be used to fill via holes 26 with the conductive paste 17 as represented by FIGS. 4D-4E and step 39 in FIG. 3. During the stencil printing with vacuum pull down process, the sheet 20 may sandwiched between a stencil layer 19 and a vacuum base 80. As a squeegee 18 roles the conductive paste 17 across the stencil layer 19, a vacuum chuck 81 of the vacuum base 80 pulls the conductive paste 17 through holes 82 of the stencil layer 19 and into the via holes 26 as shown in FIGS. 4D-4E.

Step 40 of FIG. 3 calls for determining if additional green ceramic sheet/tape/substrates with paste filled via holes are required. If additional green ceramic sheet/tape/substrates with paste filled via holes are required ("Yes" in step 40), steps 21, 28, 37 and 39 are repeated. If additional green ceramic sheet/tape/substrates with paste filled via holes are not required ("No" in step 40), step 41 of FIG. 3 is performed.

Figure 4F:
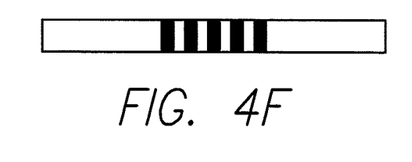
FIG. 4F depicts paste inserted into the via holes.
Figure 4G:
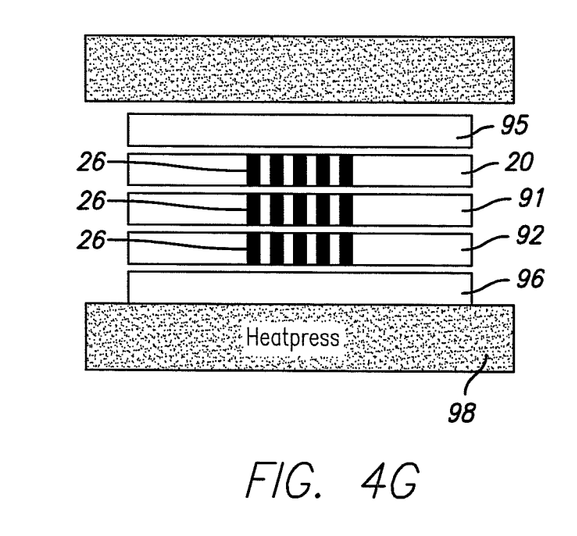
FIGS. 4G-H depict exemplary multilayer lamination process.
Figure 4H:
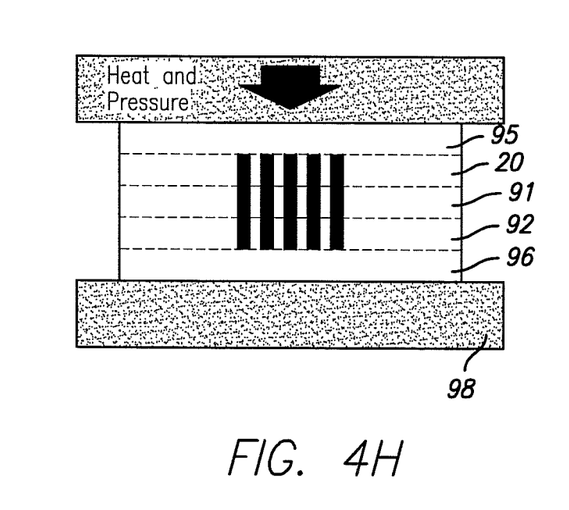

Upon completion of the stencil printing with vacuum pull down process and step 40, the sheet 20 with via holes 26 filled with conductive paste 17 shown in figure FIG. 4F may go through a multilayer lamination process as represented by FIGS. 4G-4H and step 41 in FIG. 3.

In the multilayer lamination process, the sheet 20 of FIG. 4F may be laminated with, for example, sheets 91 and 92 as shown in FIG. 4G. The sheets 91 and 92 may contain conductive paste filled vias 26 that are similar to the conductive paste filled vias 26 of the sheet 20 and the sheets 91 and 92 may be formed using steps 21, 28, 37 and 39 of FIG. 3 as described above.

Figure 4I:
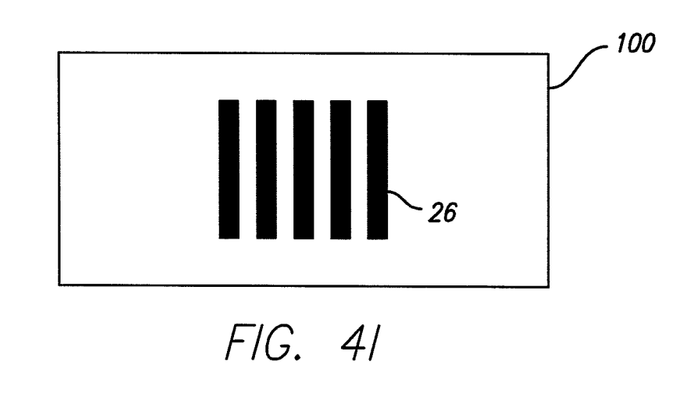
FIG. 4I shows an exemplary laminated substrate.

During the multilayer lamination process, a) the sheets 20, 91 and 92 are stacked on top of each other with conductive paste filled vias 26 of each sheet being aligned on top of each other; b) stacked sheets 20, 91 and 92 are sandwiched between two unpunched green ceramic sheets/tapes/substrates 95 and 96; and c) the sheets 20, 91 and 92 and the sheets 95 and 96 are laminated together using a heatpress 98 to create laminated substrate 100 shown in FIG. 4I.

Although FIGS. 4G and 4H laminate three sheets 20, 91 and 92 with conductive paste filled vias 26, one skilled in the art can appreciate that this disclosure is not limited to three sheets and that a single sheet 20 with conductive paste filled vias may be laminated together with the sheets 95 and 96 without the additional sheets 91 and 92. Although FIGS. 4G and 4H laminate three sheets 20, 91 and 92 with conductive paste filled vias 26, one skilled in the art can appreciate that this disclosure is not limited to three sheets and that additional sheets with conductive paste filled vias may also be laminated together with sheets 20, 91 and 92.

Step 44 of FIG. 3 calls for the laminated substrate 100 to be fired. Firing of the laminated substrate 100 encompasses different aspects of forming bonds in ceramic (evaporation, binder burnout, sintering, etc.). The unpunched ceramic layers 95 and 96 of the laminated substrate 100 help to constrain the conductive paste within via holes 26 and allow for compression during the firing step 44. The unpunched ceramic layers 95 and 96 of the laminated substrate 100 also help to isolate the conductive paste filled vias 26 from the firing atmosphere during the step 44 which may be the key to hermetic and low resistance paste filled vias 26. An exemplary firing schedule includes ramping the laminated substrate 100 of FIG. 4I up to 600° C. at a rate of 1° C./minute, then ramping up to 1600° C. at a rate at 5° C./minute, followed by a one hour dwell and then a cool-to-room-temperature interval.

During the firing and subsequent cooling during the step 44, the ceramic material of the laminated substrate 100 shrinks thereby shrinking via holes 26 around the paste 17 to form a seal. The fine aluminum oxide suspension permits uniform and continuous sealing around the surface of the paste 17. Additionally, at the maximum firing temperature, e.g., 1600° C., the paste 17 being squeezed by the ceramic exhibits sufficient flow to enable the paste 17 to flow and fill any crevices in the ceramic. This action produces a hermetic paste/ceramic interface. Furthermore, the firing step 44 may also cause hermeticity through bonding mechanisms like, for example, sintering, glass melt/wetting, alloying, compounding and/or diffusion solution formation. "Sintering" as used herein is a term used to describe the consolidation of the ceramic material during firing. Consolidation implies that within the ceramic material, particles have joined together into an aggregate that has strength. The term sintering may be used to imply that shrinkage and densification have occurred; although this commonly happens, densification may not always occur. □"Sintering" is also a method for making objects from powder, by heating the material (below its melting point) until its particles adhere to each other. "Sintering" is traditionally used for manufacturing ceramic objects, and has also found uses in such fields as powder metallurgy. "Alloying" as used herein refers to an alloy that is a homogeneous hybrid of two or more elements, at least one of which is a metal, and where the resulting material has metallic properties. "Compounding" as used herein refers to a chemical compound that is a substance consisting of two or more elements chemically-bonded together in a fixed proportion by mass. "Diffusion solution formation" as used herein refers is the net movement of particles from an area of high concentration to an area of low concentration. A solid solution is a solid-state solution of one or more solutes in a solvent. Such a mixture is considered a solution rather than a compound when the crystal structure of the solvent remains unchanged by addition of the solutes, and when the mixture remains in a single homogeneous phase. Also, the firing step 44 may also cause solidification of the metalized vias 26 and the ceramic material of the laminated substrate 100 to prevent leaks.

Figure 4J:
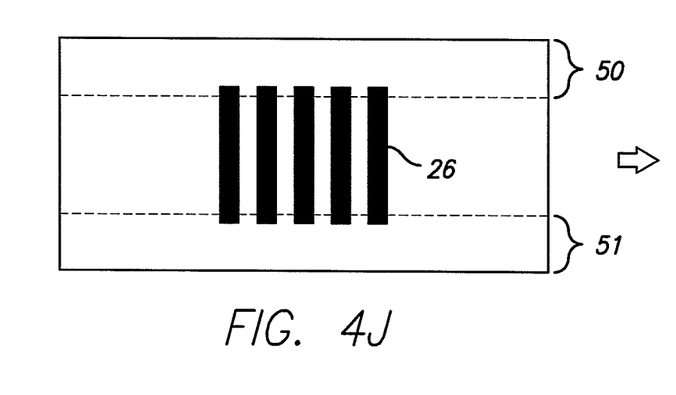
FIGS. 4J-K depict lapping/grinding process.
Figure 4K:
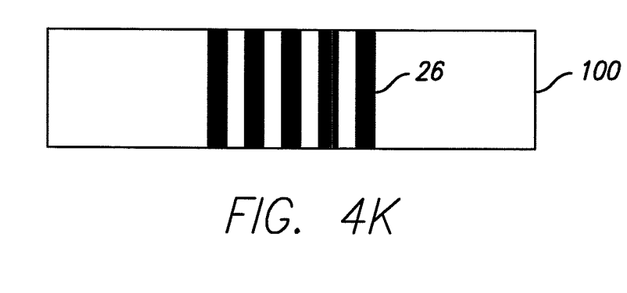

Step 48 of FIG. 3 calls for lapping or grinding the upper and lower surfaces of the fired laminated substrate 100 to remove materials 50 and 51, depicted in FIG. 4J, in order to expose the upper and lower faces of the metalized vias 26. The upper and lower surfaces of the fired laminated substrate 100 may also go through the polishing step 49 so that the metalized vias 26 are flush with the surrounding ceramic material.

After lapping and/or grinding, the fired laminated substrate 100 may be subjected to a hermeticity test, e.g., frequently a helium (He) leak test as represented by step 56 in FIG. 3.

Figure 4L:
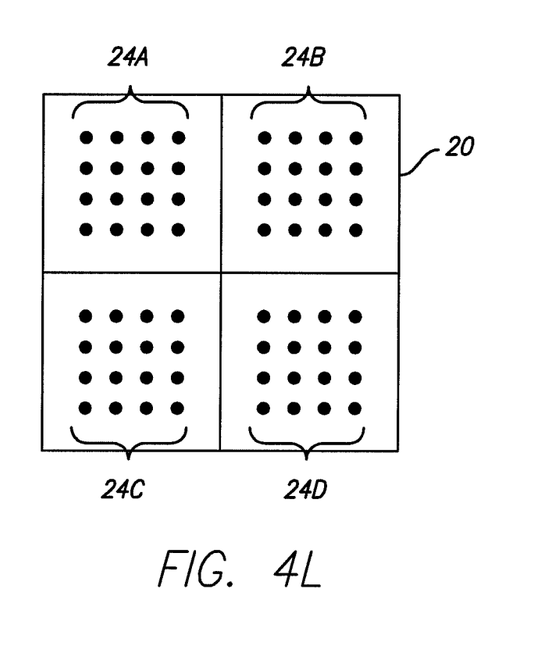
FIGS. 4L-M depict dicing of the substrate to form multiple feedthrough assemblies.
Figure 4M:
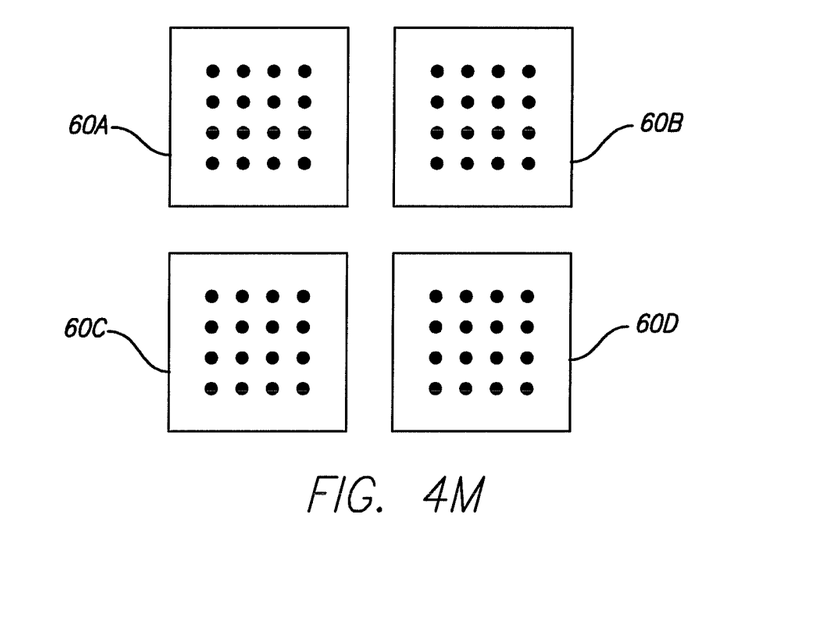

In one exemplary embodiment, sheet/substrate 20 may contain several patterns 24a-d of the via holes 26 as shown in FIG. 4L. In this exemplary embodiment, the fired laminated substrate 100 would contain several patterns 24a-d of the metal filled via holes 26 and the fired laminated substrate 100 would be subjected to a singulation or dicing step 58 to provide multiple feedthrough assemblies 60A, 60B, 60C, 60D shown in FIG. 4M.

Although some embodiments described above employ a ceramic sheet of >90% aluminum oxide ($AlO_2$), alternative embodiments may use other ceramic materials, e.g., zirconium. Because the firing temperature of the ceramic can be tailored within certain limits, the conductive paste 17 may comprise any of the noble metals and/or any of the refractory metals, for example, platinum, titanium, gold, palladum, tantalum, niobium.

As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

From the foregoing, it should now be appreciated that electrical feedthrough assemblies and fabrication methods thereof have been described suitable for use in medical devices intended for implantation in a patient's body. Although a specific structure and fabrication method has been described, it is recognized that variations and modifications will occur to those skilled in the art coming within the spirit and scope of the invention as defined by the appended claims.

What is claimed is:

1. A method of fabricating a hermetic electrical feedthrough, the method comprising:
    providing a plurality of biocompatible electrochemically stable ceramic sheets having an upper surface and a lower surface;
    forming a plurality of via holes in said plurality of ceramic sheets extending from said upper surface to said lower surface of said ceramic sheets;
    stacking said plurality of ceramic sheets, wherein said via holes filled with said conductive thickfilm paste of each ceramic sheet are aligned with said via holes filled with said conductive thickfilm paste of said ceramic sheets;
    sandwiching said stacked plurality of ceramic sheets between an upper ceramic sheet containing no via holes and a lower ceramic sheet containing no via holes;
    laminating said stacked plurality of ceramic sheets with said lower ceramic sheet and said upper ceramic sheet forming a laminated ceramic substrate;
    inserting a biocompatible electrochemically stable conductive thickfilm paste comprised of inorganic particulate and platinum particulate into said via holes of said plurality of ceramic sheets;
    firing said laminated ceramic substrate to a temperature to sinter said laminated ceramic substrate, causing said ceramic sheet, said upper ceramic sheet and said lower ceramic sheet to form a single sintered structure, and causing said conductive thickfilm paste filled via holes to form metalized vias containing sintered inorganic particulate and causing said laminated ceramic substrate to form a hermetic seal around said metalized vias, the thickfilm paste being contained within the ceramic and isolated from the firing atmosphere;

wherein the hermetic electrical feedthrough forms a biocompatible hermetic seal through sintering, glass melt/ wetting, alloying, compounding or diffusion solution formation;

grinding said upper ceramic sheet and said lower ceramic sheet to expose an upper and a lower surface of said metalized vias wherein the hermetic electrical feedthrough is suitable for implantation in a human body, said plurality of sheets comprising less than 99% aluminum oxide.

2. The method of claim 1, wherein said ceramic sheet comprises at least 90% aluminum oxide.

3. The method of claim 1, wherein said ceramic sheet consisting essentially of at least 92% aluminum oxide.

4. The method of claim 1, wherein said ceramic sheet after said firing and grinding is less than or equal to 0.040 inches thick.

5. The method of claim 1, wherein said ceramic sheet after said firing and grinding is less than 0.015 inches thick.

6. The method of claim 1, wherein said conductive thickfilm paste is comprised of platinum.

7. The method of claim 1, wherein said metalized via has a diameter of less than or equal to 0.020 inches.

8. The method of claim 1, wherein said metalized via has a diameter of less than or equal to 0.010 inches.

9. The method of claim 1, wherein said step of providing a plurality of ceramic sheets is providing unfired ceramic sheets.

10. The method of claim 1, wherein forming said at plurality of via hole in said plurality of ceramic sheets comprises punching using a punch tool, etching using a solvent etching, laser ablating, or drilling said via hole.

11. The method of claim 1, wherein said inserting a conductive thickfilm paste into said via hole comprises:
disposing said plurality of ceramic sheets with said via holes between a stencil layer and a vacuum base, wherein said stencil layer includes at least one though hole that is aligned above said via hole;
rolling said conductive thickfilm paste across said stencil layer; and
pulling said conductive thickfilm paste into said via hole though said hole in said stencil layer with a vacuum created by said vacuum base.

12. The method of claim 1, wherein laminating said ceramic sheets with conductive thickfilm paste filled via holes between said upper ceramic sheet and said lower ceramic sheet forming said laminated ceramic substrate comprises:
placing said ceramic sheets with paste filled via holes together with said upper ceramic sheet and said lower ceramic sheet in a heatpress; and
applying heat and pressure by said heatpress until said laminated ceramic substrate forms.

13. The method of claim 1, wherein firing said laminated ceramic substrate comprises evaporating, burning out binder, and sintering said laminated ceramic substrate.

14. The method of claim 1, wherein the fired laminated ceramic substrate has a thickness of less than 0.020 inches after grinding said upper ceramic sheet and said lower ceramic sheet.

15. The method of claim 1, wherein the fired laminated ceramic substrate has a thickness of 0.015 to 0.020 inches after grinding said upper ceramic sheet and said lower ceramic sheet.

16. The method of claim 1, wherein the step of inserting a biocompatible electrochemically stable conductive thickfilm paste comprised of inorganic particulate and platinum particulate into said via holes of said plurality of ceramic sheets also is comprised of an organic resin and a solvent.

* * * * *